(12) United States Patent
Park

(10) Patent No.: US 7,550,346 B2
(45) Date of Patent: Jun. 23, 2009

(54) METHOD FOR FORMING A GATE DIELECTRIC OF A SEMICONDUCTOR DEVICE

(75) Inventor: Jeong Ho Park, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 307 days.

(21) Appl. No.: 11/498,431

(22) Filed: Aug. 2, 2006

(65) Prior Publication Data

US 2007/0032021 A1 Feb. 8, 2007

(30) Foreign Application Priority Data

Aug. 3, 2005 (KR) .................... 10-2005-0070990
Aug. 31, 2005 (KR) .................... 10-2005-0080733

(51) Int. Cl.
*H01L 21/8242* (2006.01)

(52) U.S. Cl. ................. 438/240; 438/287; 438/981
(58) Field of Classification Search .............. 438/3, 438/240–241, 287.981; 257/E21.006
See application file for complete search history.

(56) References Cited

U.S. PATENT DOCUMENTS

2003/0215995 A1* 11/2003 Wilk .................... 438/240

* cited by examiner

*Primary Examiner*—H. Jey Tsai
(74) *Attorney, Agent, or Firm*—The Law Offices of Andrew D. Fortney; Andrew D. Fortney

(57) ABSTRACT

Disclosed is a method for forming a gate dielectric in a semiconductor device. The present method includes forming a first dielectric layer on a semiconductor substrate; removing a portion of the first dielectric layer to expose a portion of the substrate; forming a nitride layer on the exposed portion of the substrate and the first dielectric layer; forming a transition metal layer on the nitride layer; and oxidizing the transition metal layer to form a transition metal oxide layer.

11 Claims, 4 Drawing Sheets

METHOD FOR FORMING A GATE DIELECTRIC OF A SEMICONDUCTOR DEVICE

BACKGROUND OF THE INVENTION

1. Field of the Invention

The present invention relates to a semiconductor device manufacturing method. More specifically, the present invention relates to a method for forming a gate dielectric of a semiconductor device.

2. Description of the Related Art

Among various manufacturing technologies of semiconductor devices, a system on chip (SOC) device equipped with memory elements and large scale integrated circuits (LSI) on a single chip has been recently developed. In SOC devices, various circuit elements, such as a processor, controller, memory device, etc., are integrated in a single chip, while such circuit elements are also conventionally formed in separate chips to be individually mounted on a printed circuit board (PCB). The SOCs have advantages in aspects of miniaturization, operational speed, low power consumption, and so on. In general, SOCs comprise a variety of transistors having a large range of operational voltages and metal oxide semiconductor (MOS) capacitors having a great capacity, wherein each transistor or capacitor includes one or more dielectric layers for use as a gate dielectric.

Conventionally, a high-temperature heat treatment is used in formation of a gate dielectric in the SOCs. However, the high-temperature heat treatment may affect a junction or well profile formed in a semiconductor substrate, thus resulting in a risk of deterioration of reliability in manufacturing processes. Moreover, dopant ions implanted in the substrate may diffuse into the dielectric during the heat treatment, which may induce gate depletion and current leakage problems.

SUMMARY OF THE INVENTION

It is, therefore, an object of the present invention to provide a method for forming a gate dielectric of a semiconductor device, wherein one or more dielectric layers are deposited at a relatively low temperature, thus reducing or minimizing effects on junction and/or well profiles in a semiconductor substrate.

Another object of the present invention is to provide a method for forming a gate dielectric that reduces or prevents diffusion of dopants into the dielectric.

To achieve the above objects, an embodiment of a method for forming a gate dielectric in a semiconductor device, according to the present invention, comprises the steps of: forming a first dielectric layer on a semiconductor substrate; removing a portion of the first dielectric layer to expose a portion of the substrate; forming a nitride layer on the exposed portion of the substrate and the first dielectric layer; forming a transition metal layer on the nitride layer; and oxidizing the transition metal layer to form a transition metal oxide layer.

In addition, another embodiment of a method for forming a gate dielectric in a semiconductor device, according to the present invention, comprises the steps of: forming a first dielectric layer on a semiconductor substrate; removing a portion of the first dielectric layer to expose a portion of the substrate; forming a transition metal layer on the exposed portion of the substrate and the first dielectric layer; oxidizing the transition metal layer to form a transition metal oxide layer; and forming a nitride layer on the transition metal oxide layer.

These and other aspects of the invention will become evident by reference to the following description of the invention, often referring to the accompanying drawings.

DETAILED DESCRIPTION OF THE INVENTION

FIGS. 1 to 4 are cross-sectional views illustrating a method for forming a gate dielectric according an embodiment of the present invention.

Figure 1:
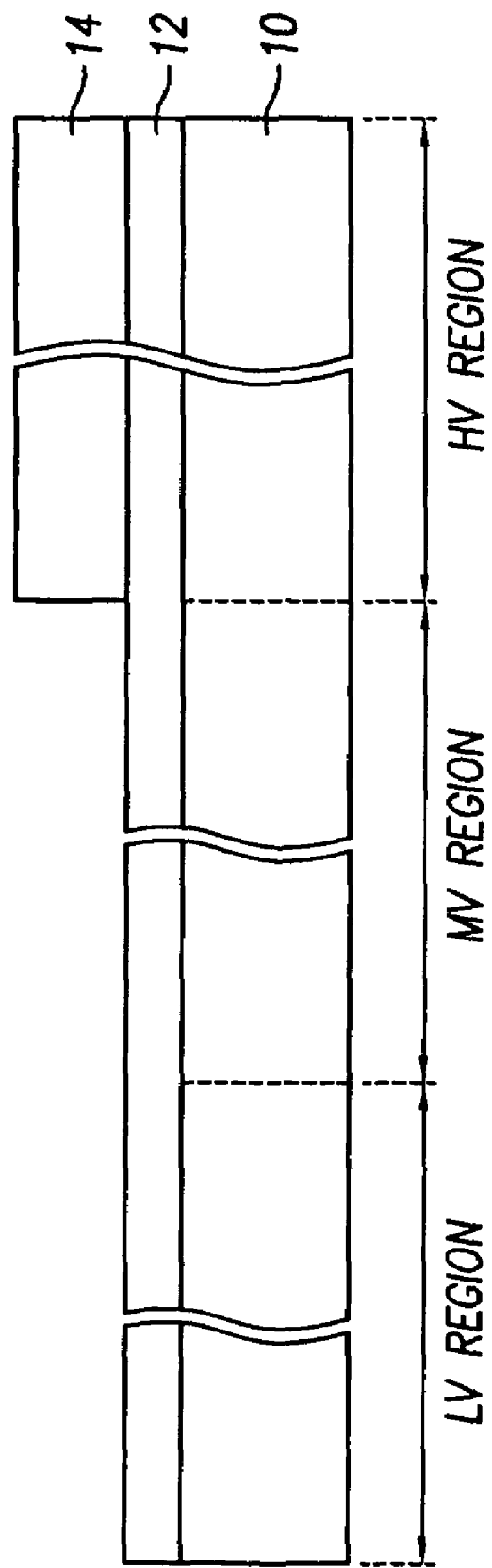
FIGS. 1 to 4 are cross-sectional views illustrating a method for forming a gate dielectric according an embodiment of the present invention.

Referring to FIG. 1, a semiconductor substrate can be divided into a low-voltage region (LV region), middle-voltage region (MV region), and high-voltage region (HV region), according to an operational voltage of the unit circuit element to be formed in each region.

Dopants are implanted in the semiconductor substrate 10 to form predetermined dopant profiles in each region. And then, a first dielectric layer 12 is formed on an entire surface of the substrate 10. The first dielectric layer 12 can comprise various dielectric materials (e.g., a silicon oxide such as $SiO_2$, a silicon oxynitride, a hafnium oxide such as $HfO_2$, etc.) and be formed using a thermal oxidation process, a chemical vapor deposition (CVD) process or a sputtering process. However, a thermal oxidation layer having superior interfacial properties and a low trap-density is preferably used as the first dielectric layer 12. Next, a first photoresist pattern 14 is formed on the first dielectric layer 12, covering the HV region. Especially, of the different operational voltage regions, the first photoresist pattern 14 only covers the HV region, and exposes the LV and MV regions.

Figure 2:
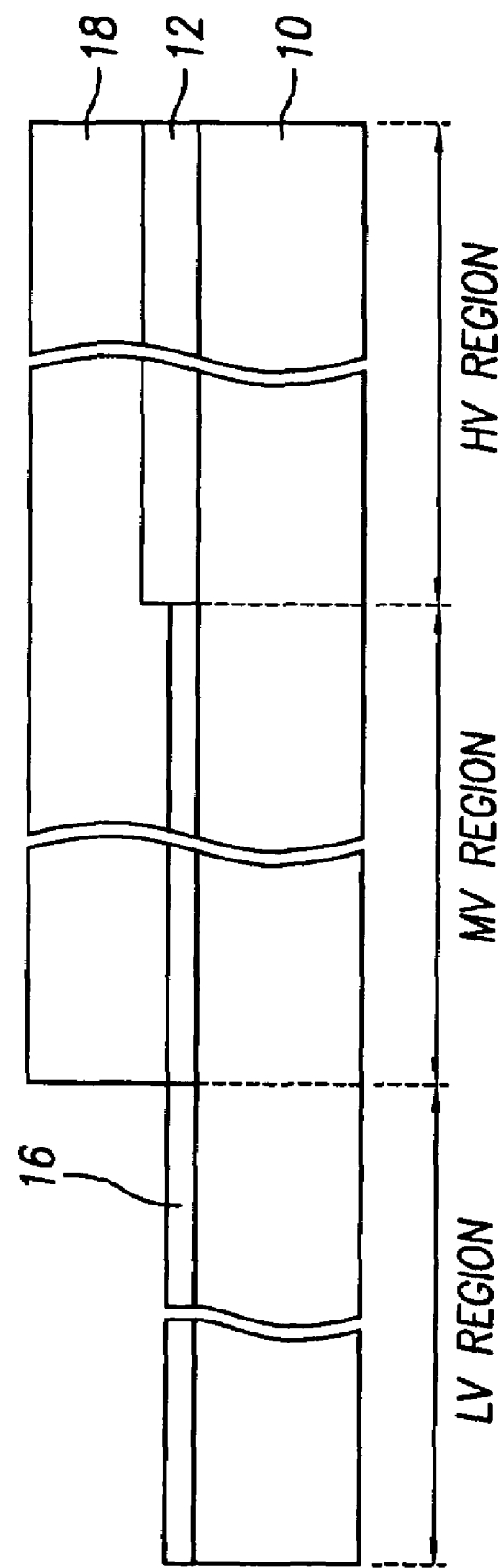

Referring to FIG. 2, the first dielectric layer 12 is etched using the first photoresist pattern 14 as an etching mask. Thus, a surface of the substrate 10 in the LV and MV regions is exposed, and a portion of the first dielectric layer 12 on the IV region remains. After removing the first photoresist pattern 14, a second dielectric layer 16 is formed on the exposed surface of the substrate 10. The second dielectric layer 16 can comprise any of the materials suitable for the first dielectric layer 12 and be formed by any of the processes suitable for the first dielectric layer 12, but as for the first dielectric layer 12, a thermal oxidation layer is preferred. Preferably, the second dielectric layer 16 is thinner (e.g., has a thickness less than) than the first dielectric layer 12. During the thermal oxidation process for the second dielectric layer 16, oxygen atoms diffuse into the HV region of the substrate 10 so that the thickness of the first dielectric layer 12 becomes greater than the initial thickness thereof. After then, a second photoresist pattern 18 is formed over the substrate 10, thus covering the MV and HV regions and exposing a portion of the second dielectric layer 16 on the LV region.

Figure 3:
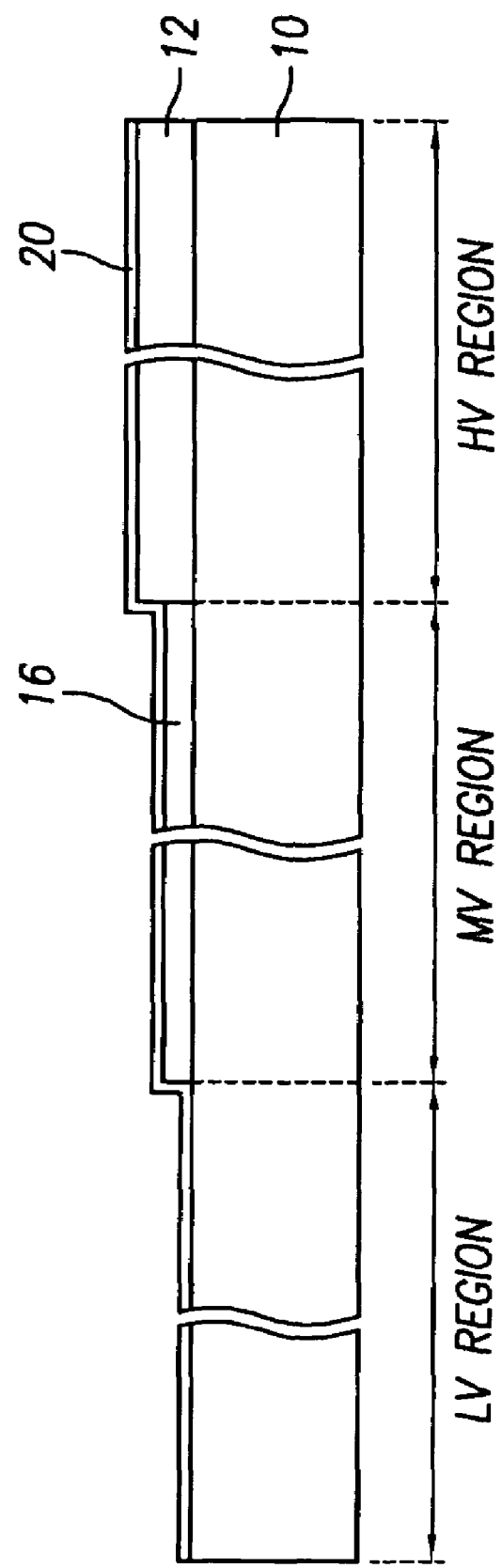

Referring to FIG. 3, the second dielectric layer 16 is etched using the second photoresist pattern 18 as an etching mask, and then the second photoresist pattern 18 is removed. Namely, a portion of the second dielectric layer 16 is removed so that a surface of the substrate 10 in the LV region is exposed. Then, a nitride layer 20 is formed on the exposed surface of the substrate 10 in the LV region, as well as on the first and second dielectric layers 12 and 16 in the MV and HV regions, by a CVD process using a forming gas. The forming gas can comprise a nitrogen source gas such as nitrogen gas, or a mixed gas of nitrogen and hydrogen. Alternatively, the nitrogen source gas may comprise ammonia ($NH_3$). The gas or gas mixture from which silicon nitride is formed may also include a silane gas, such as silane ($SiH_4$), disilane ($Si_2H_6$), chlorosilane ($SiClH_3$), dichlorosilane ($SiCl_2H_2$), etc. In the CVD process, the nitride layer 20 can be formed in the atmosphere of the forming gas, even though the substrate is heated at a relatively low temperature, e.g., at a temperature of 300° C. to 500° C. Since the nitride layer 20 is formed at a low temperature, variation of the dopant profile can be effectively reduced or prevented. In the case of using a silicon substrate, nitrogen may react with silicon from the exposed substrate of the LV region to form a silicon nitride layer. In the MV and HV regions, nitrogen may react with silicon from the first and second dielectric layers (i.e., silicon oxide layers) to form a silicon nitride layer. Because the LV region can offer more abundant silicon atoms than the MV and HV regions, a thickness of a silicon nitride on the LV region is greater than that of a silicon nitride on the MV and HV regions when the forming gas does not include a silane gas. In some embodiments, the thickness of the silicon nitride in the LV region is from about 20 to about 100 Å, and the thickness of the silicon nitride in the MV and HV regions is from about 10 to about 80 Å. Alternatively, the ratio of the thickness of the silicon nitride in the MV and HV regions to the thickness of the silicon nitride in the LV region may be from about 1:4 to about 1:1.25.

Figure 4:
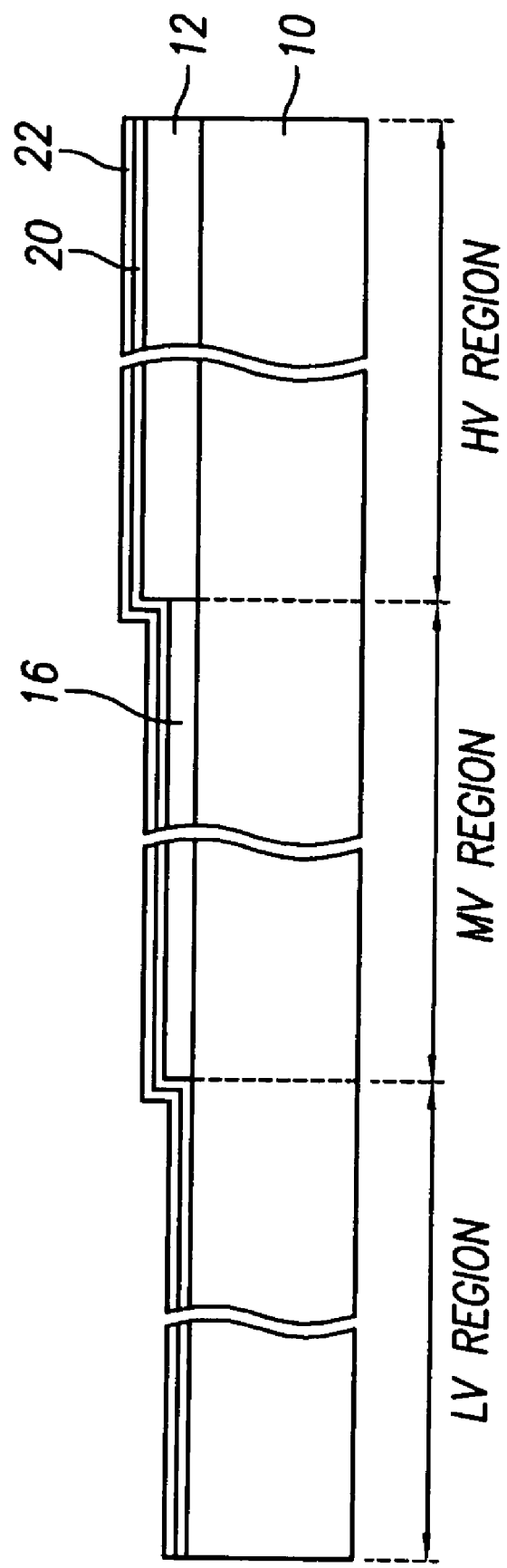

Referring to FIG. 4, a transition metal layer is deposited over an entire surface of the substrate 10 (i.e., on the nitride layer 20) using a sputtering process, and then the transition metal layer is oxidized to form a transition metal oxide layer. 22. The transition metal oxide layer 22 has a high dielectric constant and superior interfacial properties. Specifically, the transition metal layer can be formed of at least one selected from the group of, for example, tantalum (Ta), aluminum (Al), zirconium (Zr), titanium (Ti), nickel (Ni), hafnium (Hf), etc., using a physical vapor deposition (PVD) sputtering process or a CVD process, and then the transition metal layer is oxidized at a temperature of 700° C. to 950° C., using a rapid thermal oxidation (RTO) process. In some embodiments, the transition metal oxide layer 22 has a thickness of from about 20 to about 150 Å, preferably from 20 to about 100 Å. Thus, the transition metal layer may be deposited to a thickness sufficient to form a transition metal oxide layer 22 having a thickness of from about 20 to about 150 Å, etc.

Meanwhile, in the above-described embodiment, the transition metal oxide layer 22 is formed after formation of the nitride layer 20. Alternatively, the transition metal oxide layer can be formed before formation of the nitride layer. In such case, the transition metal oxide layer is formed on the exposed surface of the substrate 10 in the LV region, and on the first and second dielectric layer 12 and 16 in the MV and HV regions. The nitride layer is formed on the transition metal oxide layer. In such a case, the transition metal oxide layer and the nitride layer may have a thickness as described elsewhere herein, but the thickness of nitride layer will be substantially uniform across the different operational voltage regions.

Preferably, the transition metal oxide layer comprises silicon, in order to form a silicon nitride layer thereon. Specifically, an intermetallic compound of silicon and transition metal can be formed using a silicon source in the PVD or CVD process, and then the intermetallic compound is oxidized to form an intermetal oxide layer comprising silicon and transition metal. Therefore, nitrogen from the forming gas may react with silicon from the intermetal oxide layer to form a silicon nitride layer on the intermetal oxide layer. In such a case, the transition metal-silicon layer may be deposited to a thickness sufficient to form a bilayer comprising a lower transition metal-silicon oxide layer and an upper transition metal-silicon nitride layer, having a thickness of from about 20 to about 150 Å.

Afterward, a conductive layer (not shown) is formed on the transition metal oxide layer or the nitride layer, and then it is patterned to form gate electrodes or capacitor electrodes in the LV, MV and HV regions, according to typical semiconductor device manufacturing processes. Gate dielectrics, comprising the first or second dielectric layer 12 or 16, the nitride layer 20, and the transition metal oxide layer 22, are between the substrate and the gate electrode (or, the capacitor electrode).

According to the present invention, a nitride layer is formed on or under a transition metal oxide layer having a high dielectric constant, at a low temperature using a forming gas, so that variation of dopant profiles implanted in a substrate can be prevented. As a result, the stability of manufacturing processes can be improved.

In addition, because the present invention does not need a high-temperature heat treatment over a long operation/process time, penetration of dopants into the dielectrics can be prevented, thus ensuring the reliability of devices.

Furthermore, a nitride layer may be between a substrate and a gate electrode (or a capacitor electrode) so that penetration of dopants into one or more of the dielectrics can be prevented more effectively. Accordingly, current leakage of a capacitor or a gate depletion problem can be reduced or prevented. Especially, the present invention can be advantageously applied to a SOC device that is operated under multiple voltages.

What is claimed is:

1. A method for forming a gate dielectric in a semiconductor device, comprising the steps of:
    forming a first dielectric layer on a semiconductor substrate;
    removing a portion of the first dielectric layer to expose a first portion of the substrate;
    forming a nitride layer on the exposed first portion of the substrate and the first dielectric layer;
    forming a transition metal layer on the nitride layer; and
    oxidizing the transition metal layer to form a transition metal oxide layer.

2. The method of claim 1, wherein forming the first dielectric layer comprises thermally oxidizing the semiconductor substrate.

3. The method of claim 1, wherein forming the nitride layer comprises a chemical vapor deposition (CVD) process.

4. The method of claim 3, wherein forming the nitride layer comprises heating the semiconductor substrate in an atmosphere comprising a silane and a nitrogen source gas.

5. The method of claim 3, wherein the CVD process is performed at a temperature of 300° C. to 500° C.

6. The method of claim 1, wherein the nitride layer is formed using a forming gas.

7. The method of claim 1, wherein depositing the transition metal layer comprises a physical vapor deposition (PVD) sputtering process or a chemical vapor deposition (CVD) process.

8. The method of claim 1, wherein the transition metal layer comprises at least one member selected from the group consisting of tantalum (Ta), aluminum (Al), zirconium (Zr), titanium (Ti), nickel (Ni), and hafnium (Hf).

9. The method of claim 1, wherein oxidizing the transition metal layer comprises a rapid thermal oxidation process.

10. The method of claim 1, further comprising the steps of:
    forming a second dielectric layer on the exposed first portion of the substrate; and removing a portion of the second dielectric layer to expose a second portion of the substrate, wherein forming the nitride layer further comprises forming the nitride layer on the exposed second portion of the substrate, the first dielectric layer, and the second dielectric layer.

11. The method of claim 8, wherein forming at least one of the first and second dielectric layers comprises thermally oxidizing the substrate.

* * * * *